(12) United States Patent
Sakai et al.

(10) Patent No.: US 10,135,012 B2
(45) Date of Patent: Nov. 20, 2018

(54) DISPLAY DEVICE AND MANUFACTURING METHOD OF DISPLAY DEVICE

(71) Applicant: Japan Display Inc., Minato-ku (JP)

(72) Inventors: Shoichiro Sakai, Minato-ku (JP); Takuya Nakagawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/439,287

(22) Filed: Feb. 22, 2017

(65) Prior Publication Data
US 2017/0250357 A1 Aug. 31, 2017

(30) Foreign Application Priority Data
Feb. 26, 2016 (JP) ................. 2016-036079

(51) Int. Cl.
| H01L 51/00 | (2006.01) |
| H01L 27/32 | (2006.01) |
| H01L 51/52 | (2006.01) |
| H01L 51/56 | (2006.01) |

(52) U.S. Cl.
CPC ...... H01L 51/0097 (2013.01); H01L 27/3244 (2013.01); H01L 51/003 (2013.01); H01L 51/5253 (2013.01); H01L 51/56 (2013.01); H01L 2227/326 (2013.01); H01L 2251/5338 (2013.01)

(58) Field of Classification Search
CPC ............ H01L 51/0097; H01L 27/3244; H01L 51/003; H01L 51/5253; H01L 51/56; H01L 2227/326; H01L 2251/5338
See application file for complete search history.

(56) References Cited

U.S. PATENT DOCUMENTS

| 2011/0134018 | A1 | 6/2011 | Seo et al. | |
| 2012/0248475 | A1* | 10/2012 | Yamada | H01L 27/322 257/89 |
| 2015/0060778 | A1* | 3/2015 | Kim | H01L 27/3258 257/40 |
| 2016/0372691 | A1* | 12/2016 | Kim | H01L 51/0097 |
| 2017/0047534 | A1* | 2/2017 | Yoon | H01L 51/0097 |

FOREIGN PATENT DOCUMENTS

| JP | 2014-149517 A | 8/2014 |
| JP | 2015-050181 A | 3/2015 |

OTHER PUBLICATIONS

Office Action dated Jun. 1. 2018, in Japanese Patent Application No. 2016-036079, filed Feb. 26, 2016, w/English-language Translation, citing documents AO and AP.

* cited by examiner

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

A manufacturing substrate, on which a lamination is formed, is disposed on a first substrate. The lamination includes a first sheet substrate having flexibility and adhered to the first substrate, an organic layer that emits light such that brightness is controlled in each of a plurality of pixels forming an image in a display area, and a sealing layer. A light blocking area that does not overlap the display area in a plan view is formed on the first substrate, and after the first substrate is irradiated with light on a side that opposite to the sheet substrate, the first substrate is delaminated from the first sheet substrate.

8 Claims, 16 Drawing Sheets

FIG.13
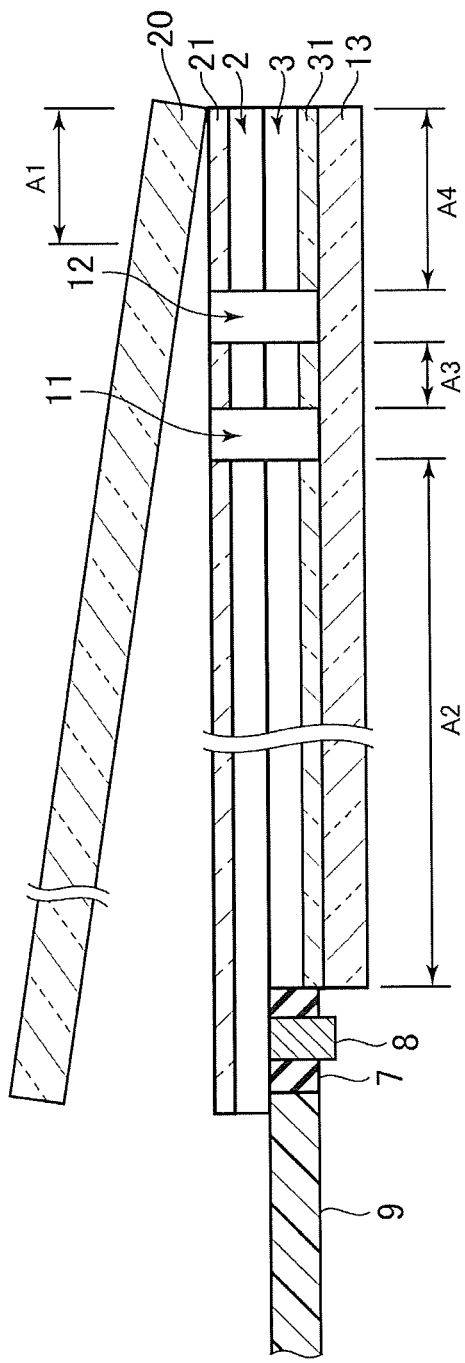
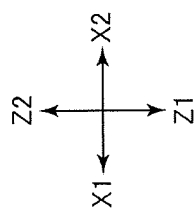

DISPLAY DEVICE AND MANUFACTURING METHOD OF DISPLAY DEVICE

CROSS-REFERENCE TO RELATED APPLICATION

The present application claims priority from Japanese application JP2016-036079 filed on Feb. 26, 2016, the content of which is hereby incorporated by reference into this application.

BACKGROUND OF THE INVENTION

1. Field of the Invention

The present invention relates to a display device, and a manufacturing method of the display device.

2. Description of the Related Art

U.S. Patent Publication No. 2011/0134018 discloses a manufacturing process of a flexible display device. In this manufacturing process, a plurality of layers for displaying images, such as a thin-film transistor (TFT), a pixel electrode (first electrode), alight-emitting layer, and a common electrode (second electrode) are formed on a flexible first sheet substrate (plastic film). A second sheet substrate, which has flexibility similarly to the first sheet substrate, is adhered to on top of these layers. In this regard, the first and second sheet substrates are respectively provided on first and second substrates, which are stronger than the sheet substrates and have light transmissivity. The first and second substrates are adhered to each other, and the first and second sheet substrates are thereby adhered to each other. This prevents the distortion or deflection of the sheet substrates at the time of adhering. After that, the first and second substrates are respectively irradiated with light, such as a laser beam, to delaminate the first and second sheet substrates from the substrates, and a final product of a display device is formed.

SUMMARY OF THE INVENTION

In the manufacturing process of the flexible display device, adhesion between the substrate having light transmissivity and the sheet substrate on the substrate is deteriorated at the time immediately after the display device is irradiated with light such as a laser beam. When the display device in this state is carried to a place where the following step (e.g., step of delaminating the substrate from the sheet substrate) is performed, sometimes the sheet substrate may come off from the substrate.

One or more embodiments of the present invention have been conceived in view of the above, and an object thereof is to prevent a sheet substrate from coming off in a process where a display device immediately after irradiated with light is carried to another place.

A manufacturing method of a display device according to the present invention includes a step of preparing a structure a including a substrate and lamination formed on the substrate, the lamination including a sheet substrate having flexibility and adhered to the substrate, a plurality of light-emitting layers respectively provided to a plurality of pixels disposed in a display area, and a sealing layer covering the light-emitting layers, a light blocking step of forming a light blocking area on the substrate, the light blocking area not overlapping the display area in a plan view, a irradiating step of irradiating light on the side of the substrate after the light blocking step, where the side being opposite to the sheet substrate; and a delaminating step of delaminating the substrate from the sheet substrate after the irradiating step. This prevents the sheet substrate from coming off when the display device immediately after irradiated with light is carried to another place.

BRIEF DESCRIPTION OF THE DRAWINGS

In the accompanying drawings:

FIG. 13 is a schematic cross-sectional view of the display device 1 indicating a step of delaminating the first substrate 20;

DETAILED DESCRIPTION OF THE INVENTION

Figure 1:
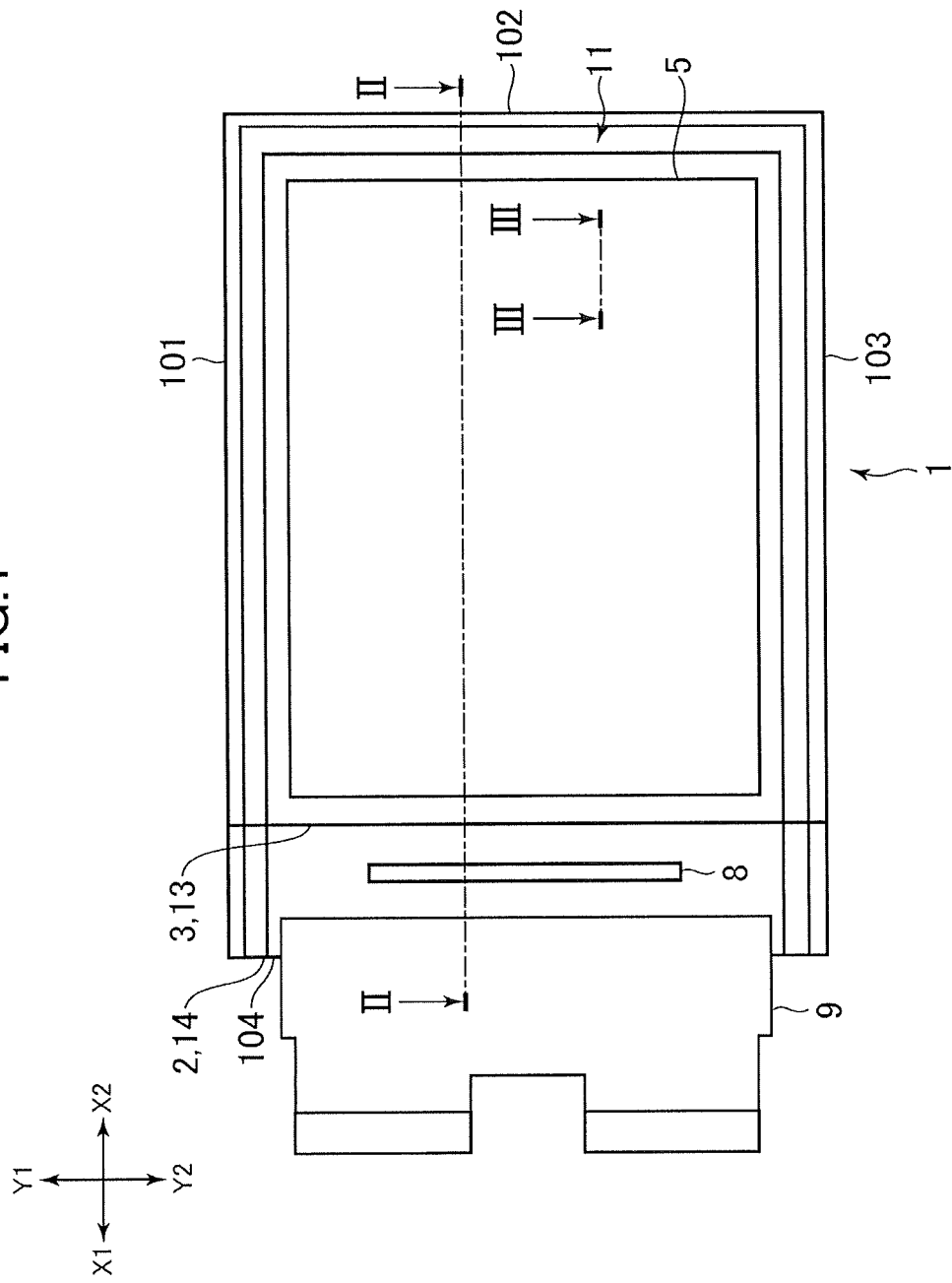
FIG. 1 is a top view of a display device 1 according to the embodiment.

In the following, a mode for implementing the invention (hereinafter referred to as "embodiment") will be described. Note that the disclosure of this specification is merely an example of the present invention, and suitable modifications within the spirit of the invention and easily conceivable by a skilled person in the art fall within the scope of the invention. Further, the width, thickness, and shape etc. of each part shown in the drawings are schematically represented, and do not limit the interpretation of the invention.

Figure 2:
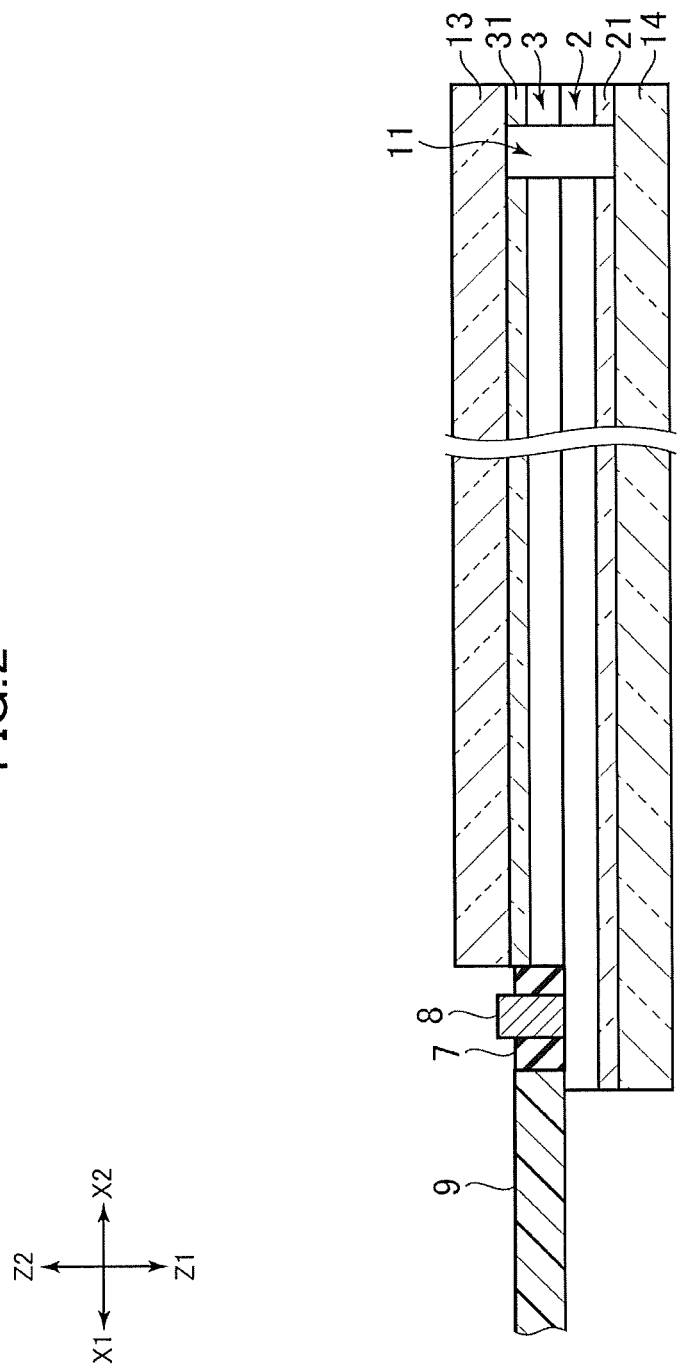
FIG. 2 is a schematic cross-sectional view of FIG. 1 taken along the line II-II.
Figure 3:
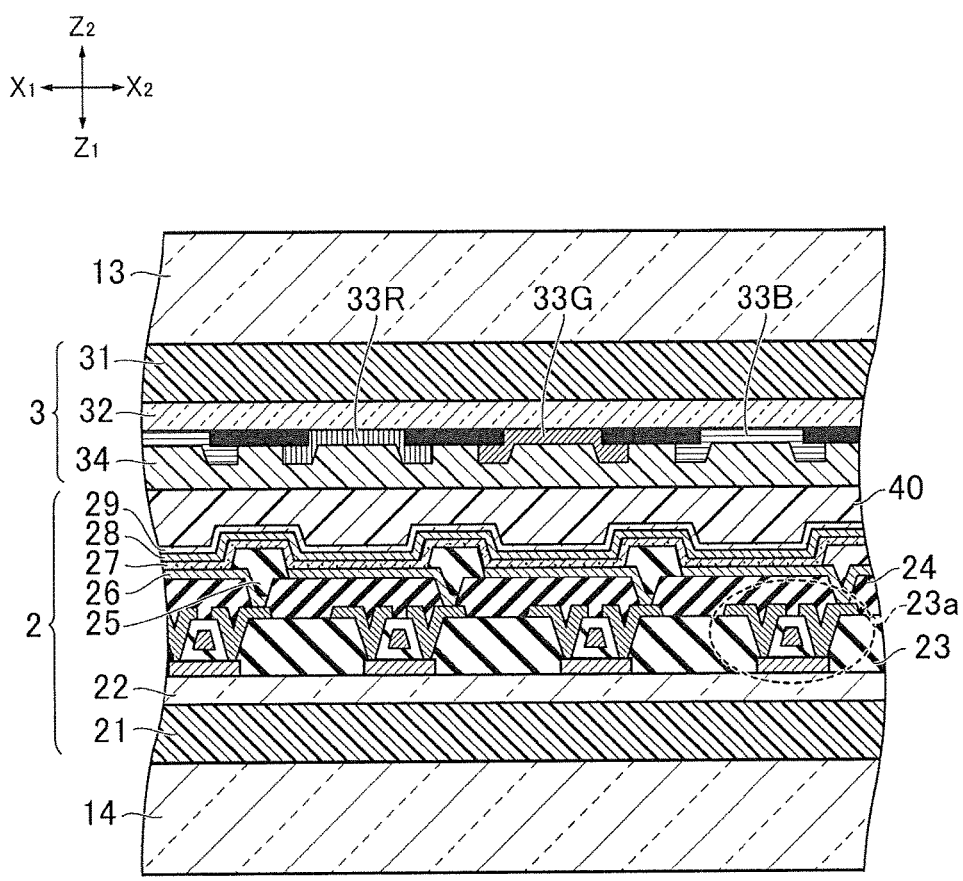
FIG. 3 is a schematic cross-sectional view of FIG. 1 taken along the line III-III.
Figure 4:
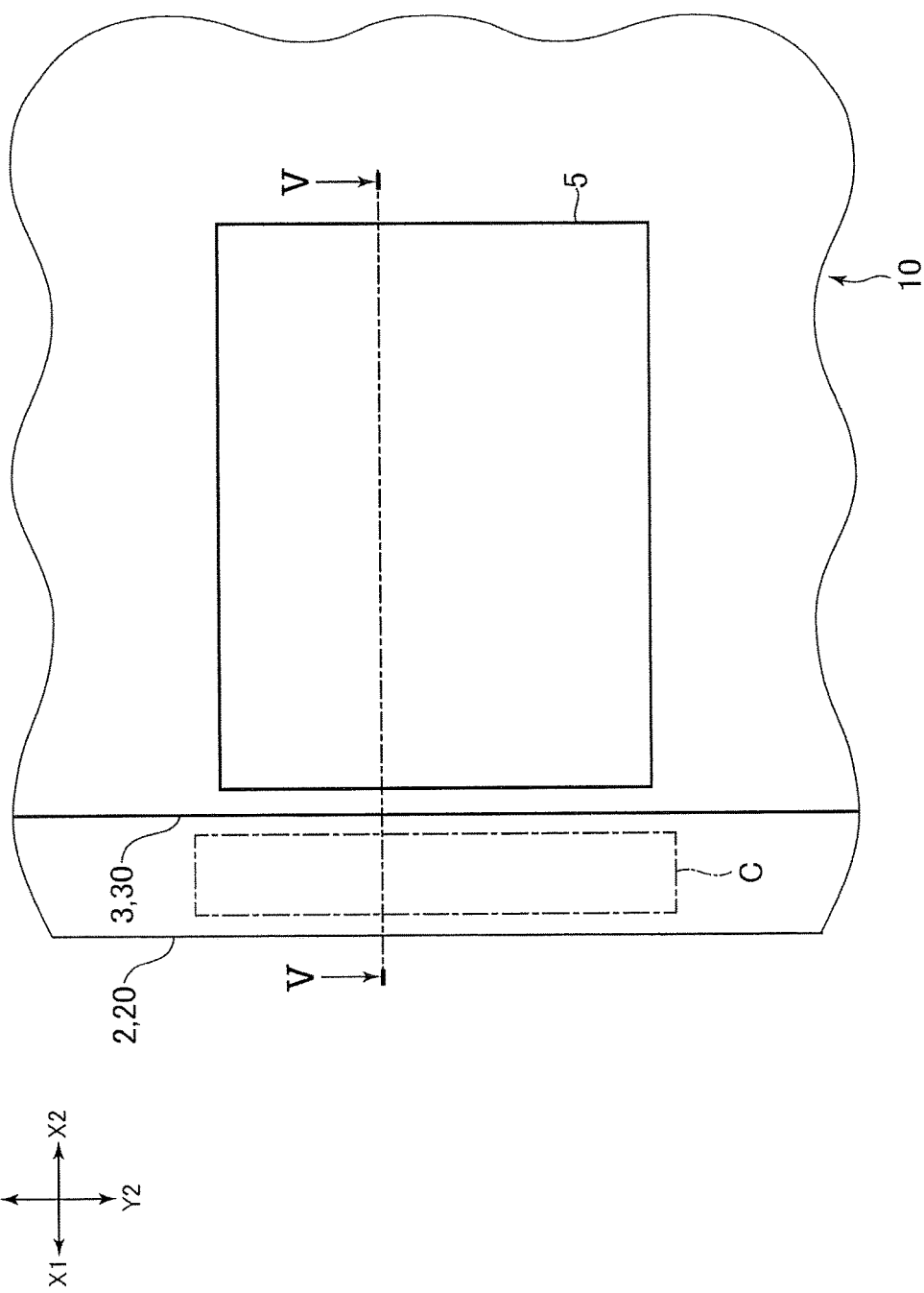
FIG. 4 is a top view of the display device 1 in a manufacturing process.
Figure 5:
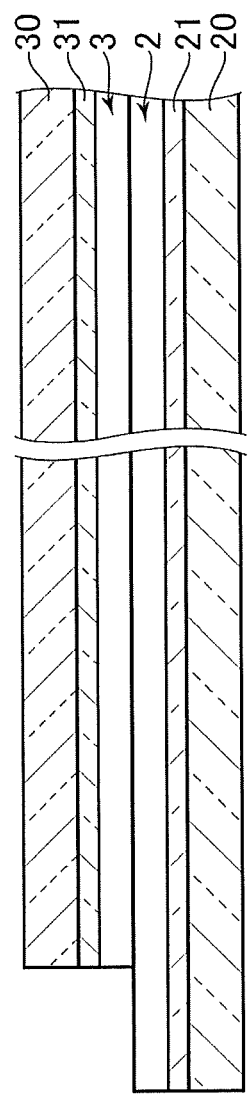
FIG. 5 is a schematic cross-sectional view of FIG. 4 taken along the line V-V.
Figure 6:
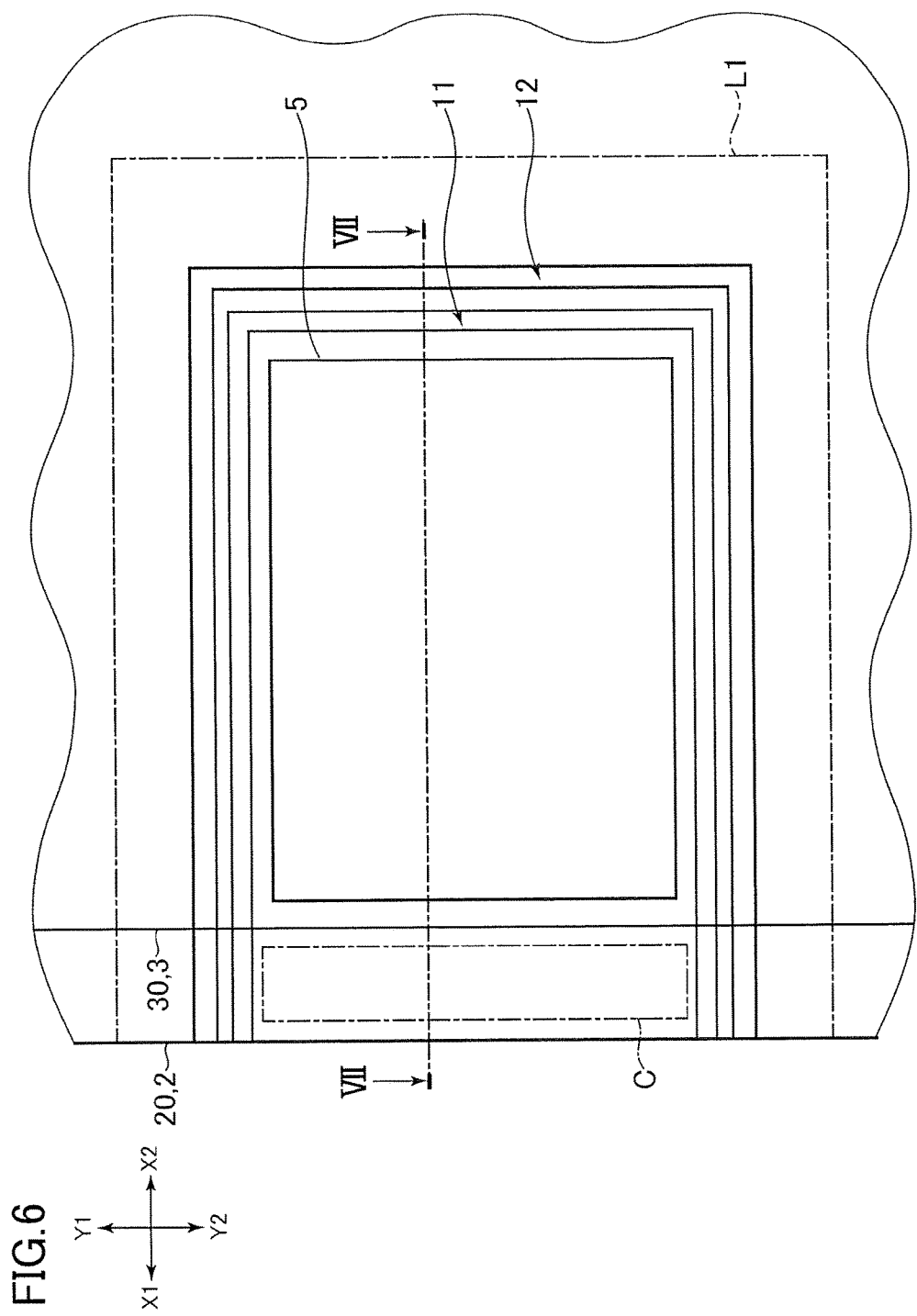
FIG. 6 is a top view of the display device 1 for showing an inner divider line 11 and an outer divider line 12.
Figure 7:
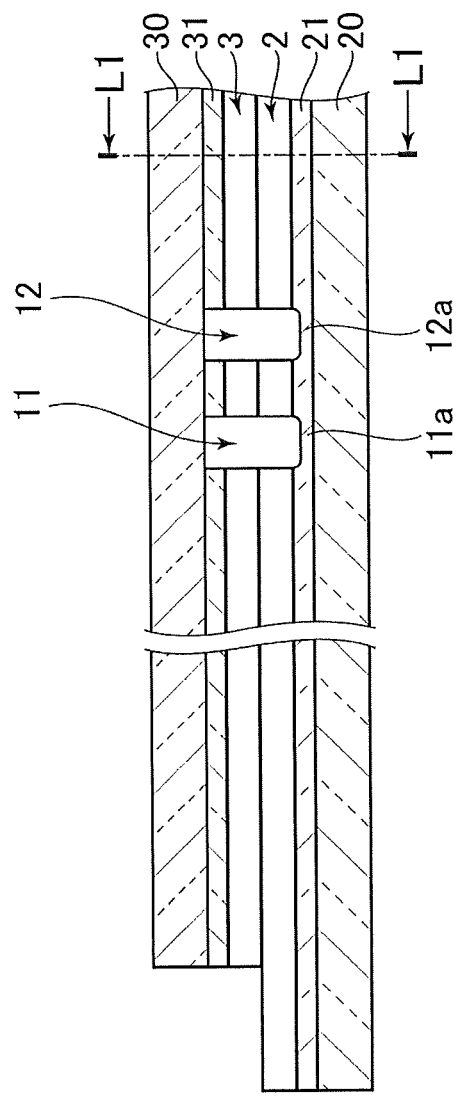
FIG. 7 is a schematic cross-sectional view of FIG. 6 taken along the line VII-VII.
Figure 8:
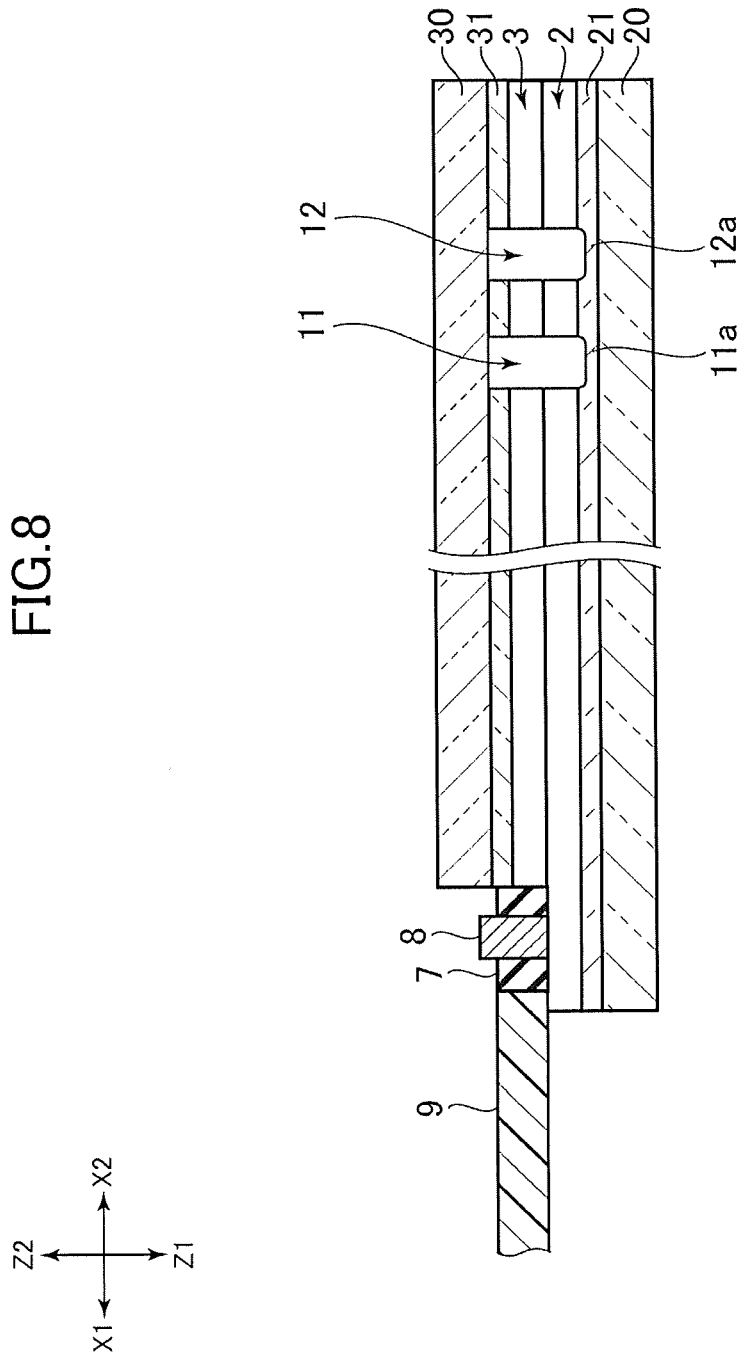
FIG. 8 is a schematic cross-sectional view of the display device 1 attached with a driver IC8 and a flexible printed board 9.
Figure 9:
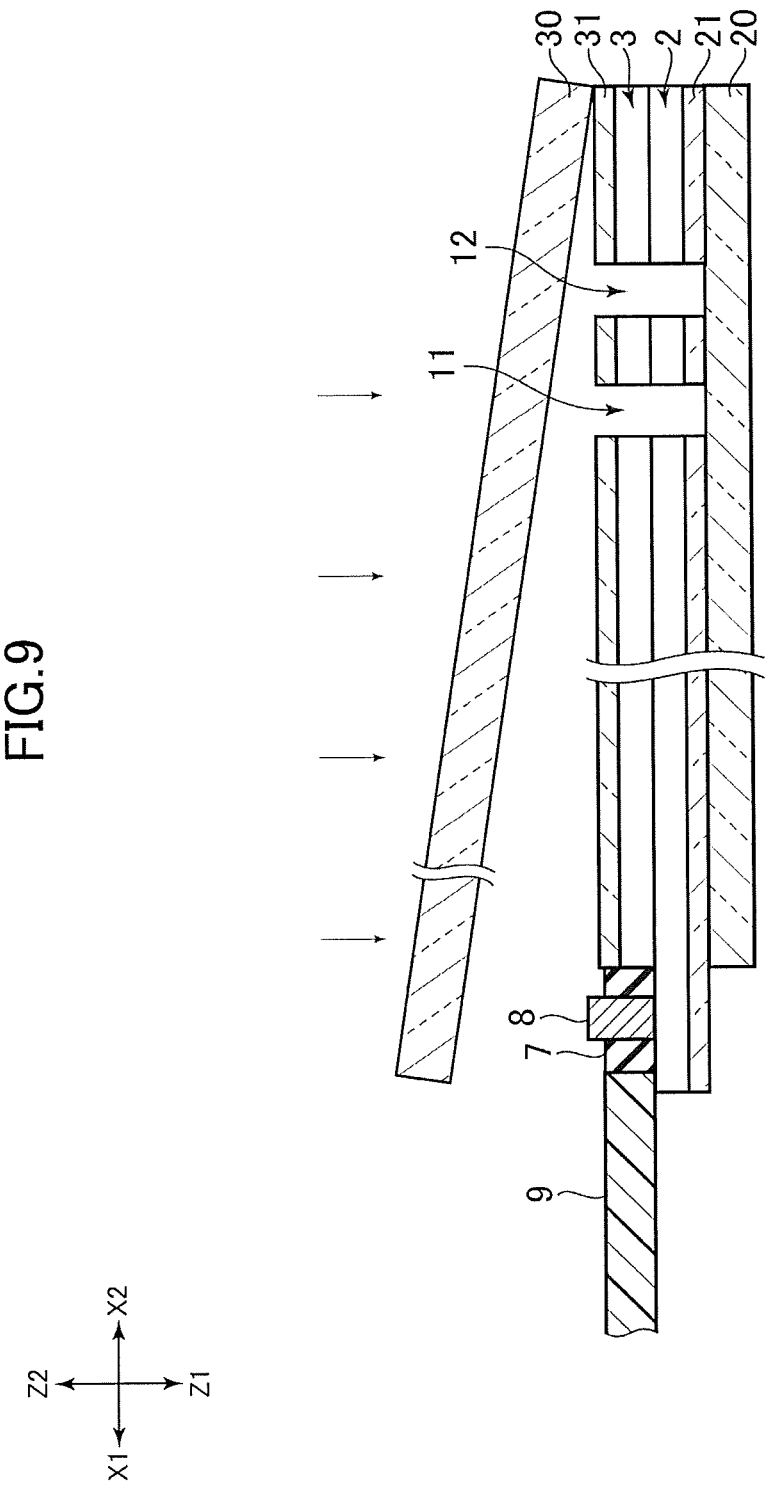
FIG. 9 is a schematic cross-sectional view of the display device 1 for showing a step of delaminating a second substrate 30.
Figure 10:
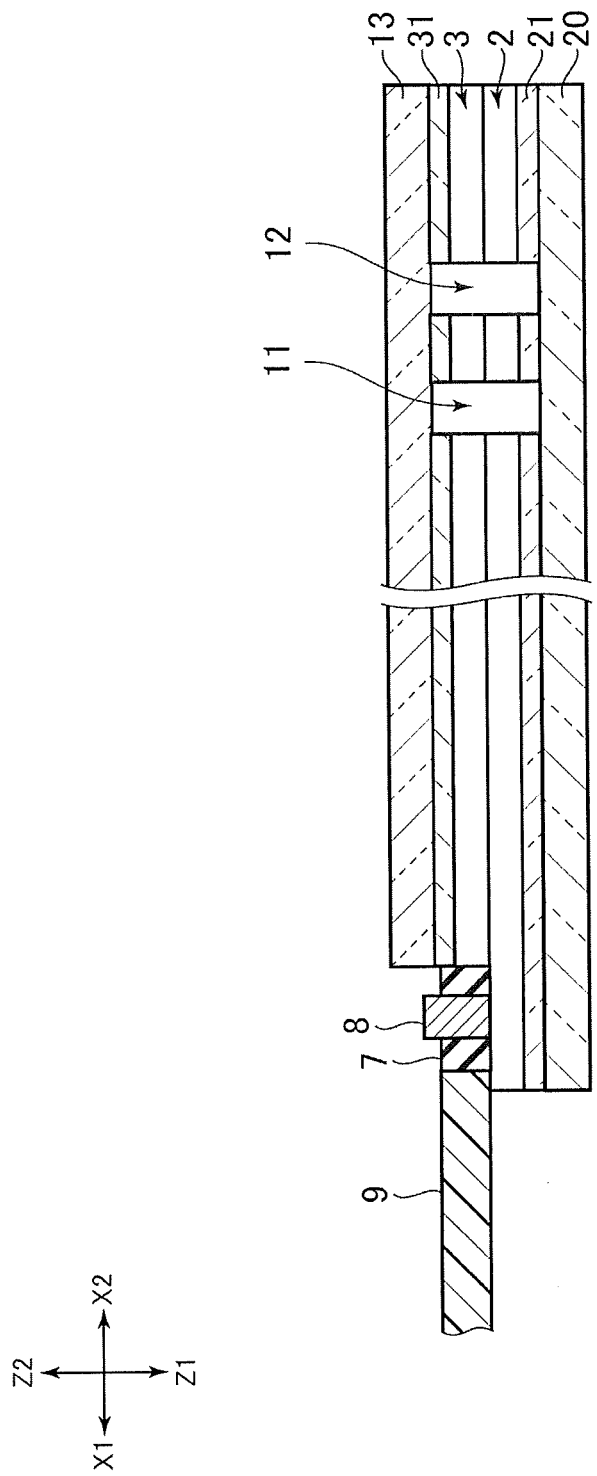
FIG. 10 is a schematic cross-sectional view of the display device 1 attached with a protective film 13.
Figure 11:
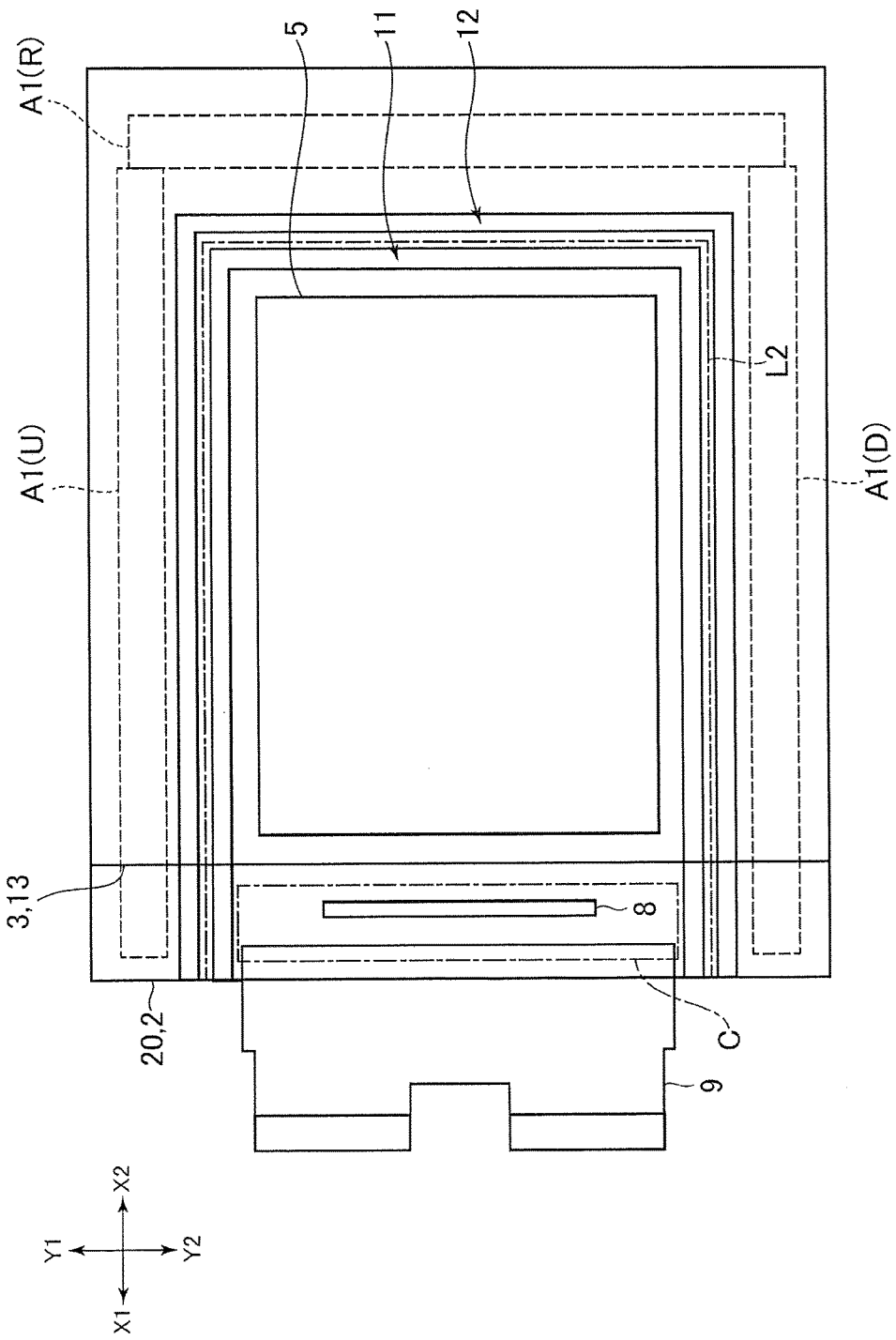
FIG. 11 is a top view of the display device 1 indicating a light blocking area A1.
Figure 12:
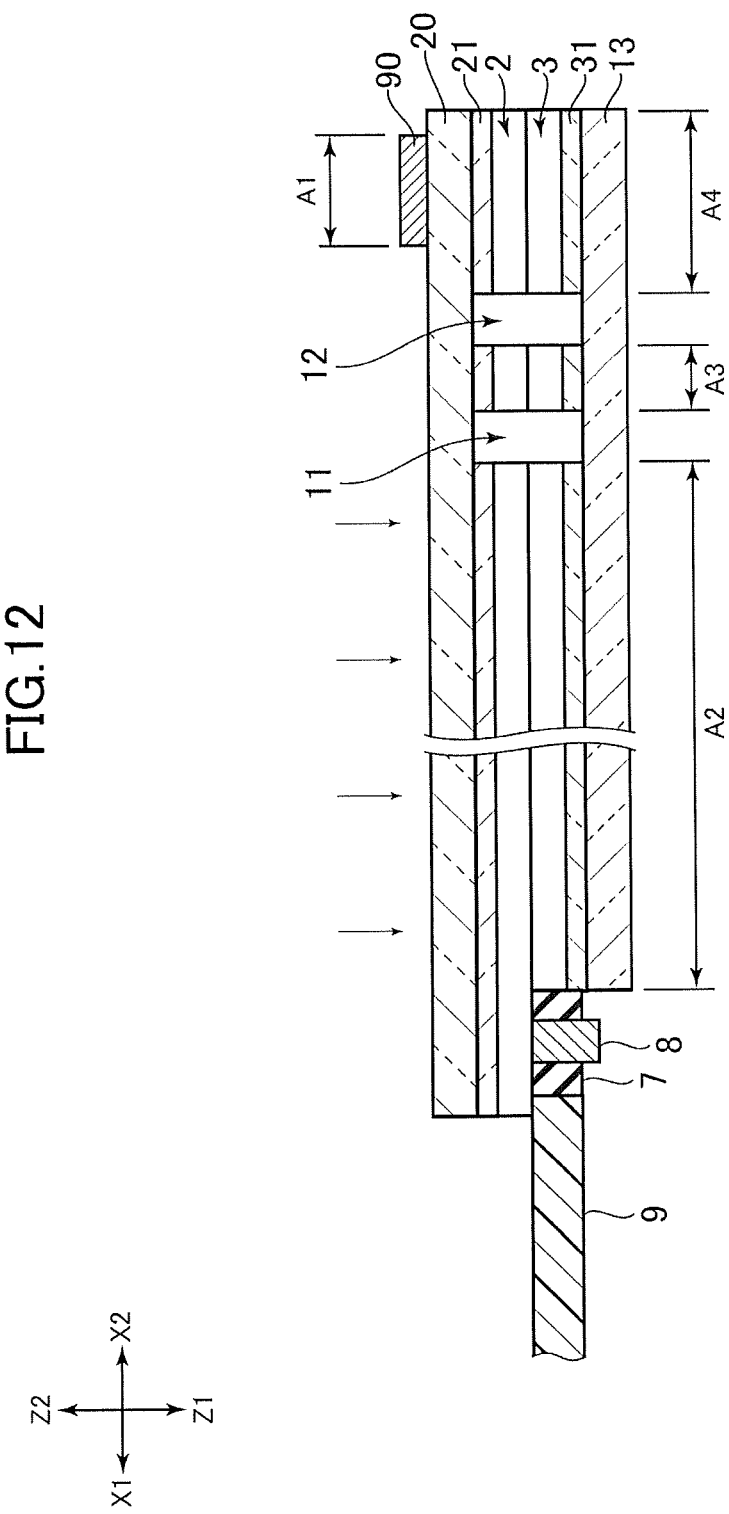
FIG. 12 is a schematic cross-sectional view of the display device 1 indicating a step of irradiating light to a first substrate 20.
Figure 14:
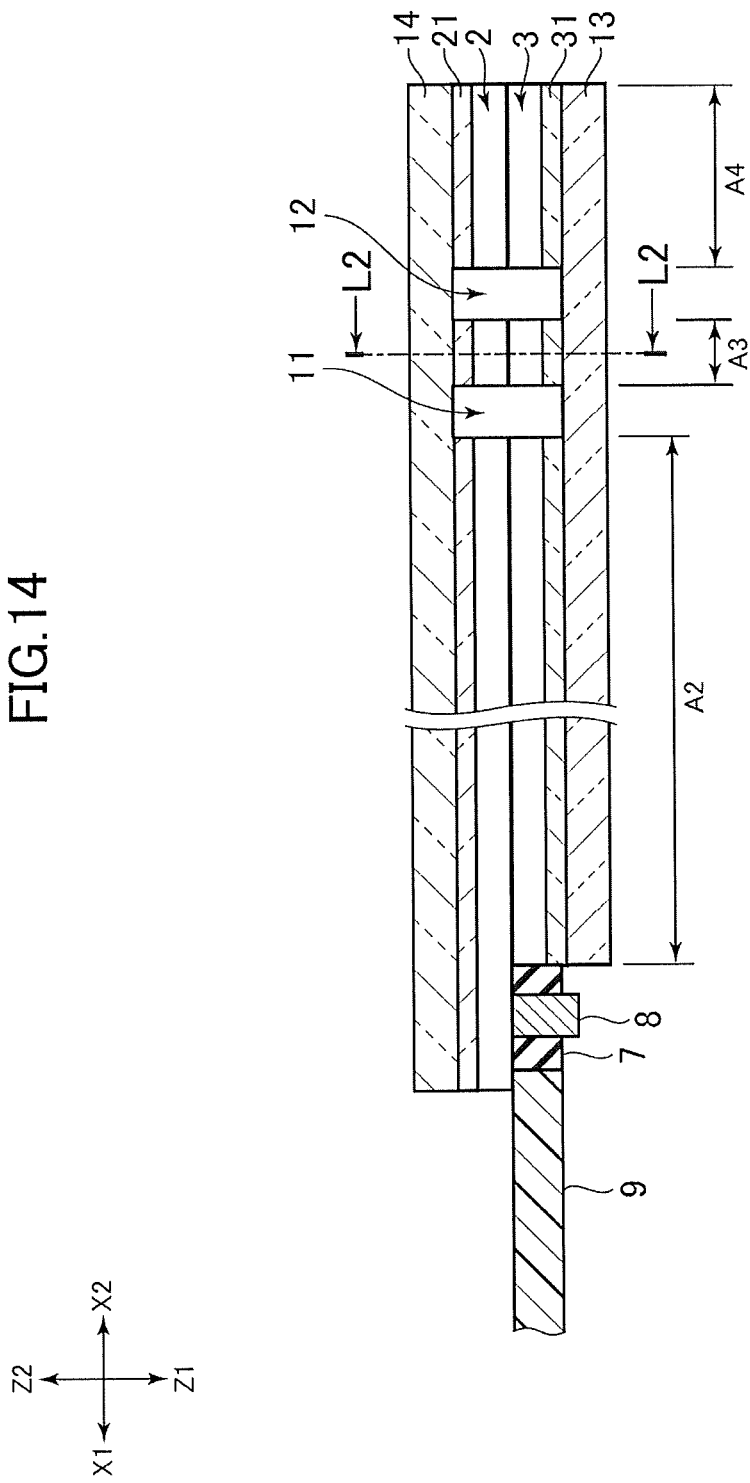
FIG. 14 is a schematic cross-sectional view of the display device 1 attached with a protective film 14.

FIG. 1 is a top view of a display device 1 according to this embodiment. FIG. 2 is a schematic cross-sectional view of FIG. 1 taken along the line II-II. FIG. 3 is a schematic cross-sectional view of FIG. 1 taken along the line and enlarges a part corresponding to the part of the cross-sectional view shown in FIG. 2. FIG. 4 is a top view of the display device in a manufacturing process. FIG. 5 is a schematic cross-sectional view of FIG. 4 taken along the line V-V. FIG. 6 is a top view of the display device 1 indicating an, inner divider line 11 and an outer divider line 12. FIG. 7 is a schematic cross-sectional view of FIG. 6 taken along the line VII-VII. FIG. 8 is a schematic cross-sectional view of the display device 1 attached with a driver 108 and a flexible printed board 9. FIG. 9 is a schematic cross-sectional view of the display device 1 indicating a step of delaminating a second substrate 30. FIG. 10 is a schematic cross-sectional view of the display device 1 attached with a protective film 13. FIG. 11 is a top view of the display device 1 indicating a light blocking area A1. FIG. 12 is a schematic cross-sectional view of the display device 1 indicating a step of irradiating light to a first substrate 20. FIG. 13 is a schematic cross-sectional view of the display device 1 indicating a step of delaminating the first substrate 20. FIG. 14 is a schematic cross-sectional view of the display device 1 attached with a protective film 14. In the following, positional relationship of respective elements will be discussed using X-axis (X1 direction, X2 direction), Y-axis (Y1 direction, Y2 direction), and Z-axis (Z1 direction, Z2 direction) coordinates.

1. Configuration of Display Device

As shown in FIG. 1, in a plan view, the display device 1 includes a display area 5 that is a substantially rectangular area for displaying images. The display area 5 has four edges. The display device 1 formed in a sheet-like shape has flexibility, and thus can display an image in the display area 5 even though the display device 1 is deflected to a certain extent. Further, the display device 1 has a driver IC (Integrated Circuit) 8 for controlling display of an image in the display area 5 and flexible printed circuits (FPC) 9 for transmitting a predetermined voltage, a control signal, and an image signal to the display device 1. The display device 1 receives an image signal through the flexible printed board 9, thereby displaying an image in the display area 5.

As shown in FIGS. 1 and 2, a first lamination 2 including a flexible first sheet substrate 21, and a second lamination 3 including a flexible second sheet substrate 31 are formed on the display device 1. As shown in FIG. 2, the first sheet substrate 21 is disposed below the first lamination 2 (in the direction Z1), and the second sheet substrate 31 is disposed on the second lamination 3 (in the direction Z2). The first sheet substrate 21 is a substantially rectangular sheet. The first sheet substrate 21 has for edges. More specifically, the first sheet substrate 21 has a first edge 101, a second edge 102, a third edge 103, and a fourth edge 104. The first sheet substrate 21 and the second sheet substrate 31 may be made of polyimide, for example, but not limited to this as long as it is a flexible material.

A sheet substrate disposed on the side where the display device 1 irradiates light desirably has light transmissivity. For example, in a case where the display device 1 irradiates light to the second sheet substrate 31 side (in a case of employing a so-called top emission type), the first sheet substrate 21 may be opaque, and the second sheet substrate 31 is desirably transparent or translucent.

A protective film 14 is adhered to the lower part of the first lamination 2 (more specifically, the lower surface of the first sheet substrate 21) in order to protect the first sheet substrate 21 from scratches and soils, and a protective film 13 is adhered to the upper part of the second lamination 3 (more specifically, the upper surface of the second sheet substrate 31) to protect the second sheet substrate 31.

As shown in FIGS. 1 and 2, in a plan view, the second lamination 3 and the protective film 13 are smaller than the first lamination 2 and the protective film 14 in shape, and a part of the first lamination 2 (a part in the X1 direction side in FIG. 1) in the Z2 direction side is not covered by the second lamination 3, but covered by an adhesive layer 7 formed of resin, for example. The driver IC8 and the flexible printed board 9 are attached to the first lamination 2 via the adhesive layer 7.

As shown in FIGS. 1 and 2, in a plan view, a groove-like inner divider line 11 is formed in the display device 1 by removing the first lamination 2 and the second lamination 3 in an area that does not overlap the display area 5. The inner divider line 11 runs along three of the four edges of the display area 5 continuously, and along three of the four edges of the first sheet substrate 21 continuously too. More specifically, The inner divider line 11 runs along the first edge 101 to the third edge 103 continuously. The inner divider line 11 runs along the first edge 102 to the third edge 104 continuously, and the first edge intersects the fourth edge 104. As shown in FIG. 2, in a sectional view, the inner divider line 11 is on the protective film 14. The first lamination 2 and the second lamination 3 do not exist in the inner divider line 11. The first sheet substrate 21 and the second sheet substrate 31 do not exist in the inner divider line 11 too. The technical meaning of the inner divider line 11 will be discussed later.

As shown in FIG. 3, the first and second sheet substrates 21 and 31 are respectively formed on the first and second laminations 2 and 3. The multiple kinds of layers for executing image display functions are also formed on the first and second laminations 2 and 3. More specifically, on the first lamination 2, a first barrier layer 22, a circuit layer 23, a flattening layer 24, a bank layer 25, a pixel electrode 26, an organic layer 27, a common electrode 28, and a sealing layer 29 are formed on the first sheet substrate 21 (in Z2 direction side in FIG. 3). The protective film 14 is located at an opposite side of the first sheet substrate 21 from the sealing layer 29. On the second lamination 3, a second barrier layer 32, a color filter layer 33, and an overcoat layer 34 are formed below the second sheet substrate 31 (in Z1 direction in FIG. 3). A filler layer 40 is filled between the first lamination 2 and the second lamination 3 (more specifically, between the sealing layer 29 and the overcoat layer 34). The filler layer 40 may be formed by, for example, pouring transparent filler into a part surrounded by sealing materials that function as a bank. The protective film 13 is located at an opposite side of the second sheet substrate 31 from the sealing layer 29.

The first barrier layer 22 is formed so as to cover the upper surface of the first sheet substrate 21. The second barrier layer 32 is formed so as to cover the lower surface of the second sheet substrate 31. The first barrier layer 22 and the second barrier layer 32 protect the organic layer 27 and the circuit layer 23 from air and moisture, and may be formed of an inorganic material, such as $SiO_x$ and $SiN_y$.

The circuit layer 23 and the flattening layer 24 are formed on the first barrier layer 22. A circuit section 23a that includes a thin-film transistor (TFT) and a capacitance is formed on the circuit layer 23. The circuit section 23a controls current supply to the pixel electrode 26, thereby controlling image display of the display area 5. The flattening layer 24 is formed of an insulating material, such as resin. A hole is formed on the flattening layer 24 at a position in contact with a part of the circuit section 23a. A part of the pixel electrode 26 described later enters into the hole and thereby contacts with the circuit section 23a, and the pixel electrode 26 and the circuit section 23a are electrically connected to each other.

The organic layer 27 emits light of pixels forming display images in the display area 5 (see FIG. 1). That is, each of the pixels located in the display area 5 has an organic layer 27. The organic layer 27 is formed by laminating, for example, a hole injection layer, a hole transport layer, a light-emitting layer, an electron transport layer, and an electron injection layer, which are not shown. The light of the pixels in the display area 5 is emitted from the organic layer 27 at a part through which electricity flows. More specifically, when a drive TFT included in the circuit section 23a is turned ON, current flows through the pixel electrode 26, the organic layer 27, and the common electrode 28, each of which is electrically connected to the drive TFT, and the organic layer 27 thereby emits light of the pixels. The organic layer 27 may be disposed across all of the pixels in the display area 5. Further, in a case where the display device 1 is formed by a top emission system, each of the layers disposed on the organic layer 27 is desirably transparent or translucent.

The bank layer 25 and the pixel electrode 26 are formed so as to cover the lower surface of the organic layer 27. The pixel electrode 26 is formed of a given conductive material, and processed so as to be separated between pixels (e.g., etching). Amount of current supplied to the pixel electrode 26 provided to each of the pixels is controlled, and the organic layer 27 thereby emits light such that light emission luminance is controlled in each of the pixels. In a case where a so-called top emission system, in which the display device 1 emits light in the second sheet substrate 31 side, is employed, the pixel electrode 26 may include a material, such as metal (e.g., Ag), that reflects light. The bank layer 25 is formed of an insulating material, such as resin, and disposed so as to surround each of the pixels in the display area 5. The bank layer 25 is disposed in this way and thus prevents adjacent pixel electrodes 26 from being in contact with each other in each pixel.

The common electrode 28 is formed to cover the upper surface of the organic layer 27. The common electrode 28 may be formed of a transparent conductive material, such as indium-tin oxide (ITO) and indium zinc oxide (IZO). The sealing layer 29 is formed so as to cover the organic layer 27 and the upper surface of the common electrode 28. The sealing layer 29 protects the common electrode 28 and the organic layer 27 from oxygen and moisture, and may be formed of an inorganic material, such as SiOx and SiNy.

The color filter layer 33 and the overcoat layer 34 are formed below the second sheet substrate 31. Color filters, which transmit light of colors determined for each of a plurality of pixels, are provided on the color filter layer 33. As shown in FIG. 3, the color filters may include a color filter 33R that transmits light of red color, a color filter 33G that transmits light of green color, and a color filter 33B that transmits light of blue color. However, the color filters may not to be limited to this but may transmit light of white color, for example. The overcoat layer 34 is to prevent dyes included in the color filters from being diffused, and may be formed of a given organic material, for example.

The display device 1 may colorize light of each pixel forming a display image by separately colorizing an organic layer 27 (more specifically, a light-emitting layer not shown and included in the organic layer 27) in a predetermined color for each pixel (e.g., three colors including red, green, and blue, or four colors including these colors and white). In this case, the color filter layer 33 and the overcoat layer 34 may not necessarily be formed.

As described above, the display device 1 includes the first and second laminations 2 and 3, and the protective films 13 and 14 adhered to the laminations. The first and second laminations 2 and 3 are the laminations including the flexible first and second sheet substrates 21 and 31 and the organic layer 27, which is disposed between the first and second sheet substrates 21 and 31 and emits light by being controlled in brightness in each of pixels forming images in the display area 5. Further, the display device 1 includes the groove-like inner divider line 11, which is formed by removing the first and second laminations 2 in an area that does not overlap the display area 5 in a plan view, and in which the first and second laminations 2 and 3 do not exist.

2. Manufacturing Method of Display Device

The manufacturing process of the display device according to this embodiment includes a step of preparing a manufacturing substrate 10, which is a structure including the display device 1, a dividing step of forming an inner divider line 11 and an outer divider line 12, a cutting step of cutting the display device 1, an attaching step of attaching a driver IC 8 and a flexible printed board 9, a first delaminating step of irradiating light to the second substrate 30 and delaminating the second substrate 30 from the second sheet substrate 31, an expanding step of expanding an inner divider line 11 and an outer divider line 12, a first adhering step of adhering a protective film 13 to a second sheet substrate 31, a light blocking step of forming a light blocking area A1 on a first substrate 20, an irradiating step of irradiating light to the first substrate 20, a second delaminating step of delaminating the first substrate 20 from the first sheet substrate, a second adhering step of adhering a protective film 14 to the first sheet substrate 21, and a cutting step of cutting the display device 1 between the inner divider line 11 and the outer divider line 12. In the following, each of above mentioned steps of the manufacturing process will be discussed.

[2-1. Structure of Manufacturing Substrate]

As shown in FIGS. 4 and 5, in the manufacturing process of the display device according to this embodiment, a manufacturing substrate 10, which is a structure including the display device 1 in the manufacturing process, is prepared. The manufacturing substrate 10 has first and second hard substrates 20 and 30 each having light transmissivity. Between these two substrates, there are disposed a first lamination 2 including a first sheet substrate 21, and a second lamination 3 including a second sheet substrate 31. The first and second substrates 20 and 30 may be substrates formed of, for example, transparent glass. As shown in FIG. 5, the first sheet substrate 21 is formed on the first substrate 20 (Z2 direction side) and adhered to the first substrate 20. The second sheet substrate 31 is formed below the second substrate 30 (Z1 direction side) and adhered to the second substrate 30.

As shown in FIG. 4, an attachment area C, to which the driver IC 8 and the flexible printed board 9 are attached, is provided in a part of the first lamination 2 (a part on the X1 direction in FIG. 1) that is not covered by the second substrate 30 and the second lamination 3 in a plan view.

The manufacturing substrate 10 may include a plurality of display devices 1. In this case, the manufacturing substrate 10 may include a display area 5 that corresponds to another display device 1 (not shown) and an attachment area C that corresponds to such another display device 1 at positions apart in the Y1 direction, the Y2 direction, or the X2 direction from the display area 5 of the display device 1 shown in FIG. 1. For example, the display areas 5 are arranged along the X-axis and Y-axis directions of the manufacturing substrate 10. In a case where the manufacturing substrate 10 includes multiple display devices 1, each display device 1 is separated from the manufacturing substrate 10 in a separation state.

[2-2. Dividing Step]

Subsequently, as shown in FIGS. 6 and 7, an inner divider line 11 and an outer divider line 12 are formed between the display area 5 and a cut line L1 for cutting the display device 1 in a plan view. The inner divider line 11 and the outer divider line 12 are the parts formed by linearly removing the first and second laminations 2 and 3 (hereinafter, simply referred to as laminations). The inner divider line 11 and the outer divider line 12 are formed so as to surround the display area 5. More specifically, the outer divider line 12 runs along the respective edges of the display area 5 in the Y1 direction, the X2 direction, and the Y2 direction, and, in the Y1 direction and the Y2 direction of the display area 5, also extends to the end of the laminations in the X1 direction.

As shown in FIG. 11, the inner divider line 11 and the outer divider line 12 are formed between the display area 5 and a light blocking area A1 described later (an area to block light to the first substrate 20 before the first substrate 20 is irradiated with light such as laser and delaminated) that does not overlap the display area 5. The outer divider line 12 is disposed closer to the light blocking area A1 than the inner divider line 11. In other words, the outer divider line 12 is formed to surround the inner divider line 11, which surrounds the display area 5. In this embodiment, the inner divider line 11 corresponds to "first divider line" of the present invention, and the outer divider line 12 corresponds to "second divider line" of the present invention.

The inner divider line 11 and the outer divider line 12 may be formed by irradiating light such as a laser beam on the first substrate 20 or the second substrate 30. This causes a surface of the lamination, to which light is irradiated, to be changed in quality due to heat, to thereby form the outer divider line 12 that is a part where the lamination is removed.

[2-3. Cutting Step]

Next, the manufacturing substrate 10 is cut along the cut line L1 shown in FIGS. 6 and 7, and the display device 1 is thereby separated from the manufacturing substrate 10. In the example shown in FIG. 6, the cut line L1 is provided to run along the respective lines of the outer divider line 12 in the Y1 direction, the X2 direction, and the Y2 direction so as to surround the outer divider line 12.

There is a case where a crack or a fracture caused by the cutting extends from the cut line L1 to the display area 5. In this case as well, the inner divider line 11 and the outer divider line 12 where the laminations are removed are formed, and thus it is possible to prevent the crack generated in the cut line L1 from extending to the display area 5 across the inner divider line 11 and the outer divider line 12.

[2-4. Attaching Step]

Next, as shown in FIG. 8, the driver IC 8 and the flexible printed board 9 are attached to the first sheet substrate 21. The driver IC 8 and the flexible printed board 9 are attached to the attachment area C (see FIG. 4) via the adhesive layer 7 on the first sheet substrate 21.

[2-5. First Delaminating Step]

Subsequently, as shown in FIG. 9, a surface of the second substrate 30 is irradiated with light such as a laser beam, and the second substrate 30 is thereby delaminated from the second sheet substrate 31. More specifically, when the second substrate 30 having light transmissivity is irradiated with light, the light shines on an adhesive surface of the second sheet substrate 31 adhered to the second substrate 30, thereby applying heat and generating ablation due to heat on the adhesive surface. This reduces adhesiveness between the second substrate 30 and the second sheet substrate 31, and thus the second substrate 30 can be delaminated from the second sheet substrate 31.

[2-6. Expanding Step]

In the dividing step described above, the inner divider line 11 and the outer divider line 12 are formed over the first substrate 20 or the second substrate 30. For this reason, as shown in FIG. 7, sometimes a portion of the lamination is not removed and left in a position along the Z axis direction of the inner divider line 11 (hereinafter referred to as remaining portion 11a). Similarly, sometimes a remaining portion 12a remains in a position along the Z-axis direction of the outer divider line 12. As such, as shown in FIG. 9, in this expanding step, the remaining portions 11a and 12a are removed so as to expand the inner divider line 11 and the outer divider line 12 in the Z axis direction. In this way, a part where the lamination is divided is formed in the display device 1 in a sectional view.

[2-7. First Adhering Step]

Next, as shown in FIG. 10, a protective film 13 is adhered to the surface opposite to the surface on which the first substrate 20 of the lamination is disposed (specifically, the surface of the second sheet substrate 31 from which the second substrate 30 is delaminated). As shown in FIGS. 11 and 12, the protective film 13 covers the display area 5 in a plan view, and runs to a light blocking area A1 described later across the inner divider line 11 and the outer divider line 12. The protective film 13 may be formed of a material such as PET, and adhered to the second sheet substrate 31 via a double-sided adhesive sheet not shown, or adhered to the second sheet substrate 31 using an adhesive on the surface.

[2-8. Light Blocking Step]

Next, as shown in FIGS. 11 and 12, the light blocking area A1, which is an area to block light such as a laser beam, is formed in an area that does not overlap the display area 5 of the first substrate 20. In this embodiment, the light blocking area A1 is formed so as to surround the display area 5, and to surround the inner divider line 11 and the outer divider line 12.

More specifically, the light blocking area A1 includes two areas, which are disposed such that they face each other across the display area 5, a first area U running along the edge of the display area 5 in the Y1 direction, and a second area D running along the edge of the display area 5 in the Y2 direction. Further, the light blocking area A1 includes a third area R running along the edge of the display area 5 in the X2 direction. The third area R may or may not be connected to the first and second areas U and D. In the example of FIG. 11, although the first to third areas U, D, and R included in the light blocking area A1 all extend linearly, but these areas may be formed to have a discontinued part in the middle position and formed in, for example, a dotted line.

The light blocking area A1 is formed, in a plan view, not to overlap at least an area that forms a final product of the display device 1 (e.g., an area divided by a cut line L2 described later). For example, as shown in FIG. 11, the light blocking area A1 is not formed in the X2 direction side of the display area 5, and does not overlap the attachment area C to which the flexible printed board 9 is attached on the first substrate 20.

The light blocking area A1 may be formed by mounting a case 90 (e.g., a case made of metal), which is formed in a way to cover the light blocking area A1 and expose areas other than the light blocking area A1, to the display device 1. Alternatively, the light blocking area A1 may be formed by painting surfaces of the first substrate 20 in a given color, or affixing a masking tape to the first substrate 20.

[2-9. Irradiating Step]

Next, light such as a laser beam is irradiated on a side of the first substrate 20, where the side is opposite to the second sheet substrate 31. For example, as shown in FIG. 12, the display device 1 may be reversed upside down and irradiated with light from an upper side (Z2 direction side) of the display device 1, or irradiated with light from a lower side of the display device 1 (Z1 direction side) without being reversed upside down.

As described, the first substrate 20 having light transmissivity is irradiated with light, and ablation is thereby generated on the adhesive surface of the first sheet substrate 21 adhered to the first substrate 20. This causes the irradiated part of the first sheet substrate 21 to have weaker adhesiveness with the first substrate 20, and the first substrate 20 can thereby be delaminated from the first sheet substrate 21. On the other hand, ablation of the first sheet substrate 21 is not generated on the light blocking area A1, which is the non-irradiated part of the first sheet substrate 21, adhesiveness with the first substrate 20 is maintained. As described, the part adhered to the first substrate 20 remains on the first sheet substrate 21, and thus, it is possible to prevent the first sheet substrate 21 from coming off from the first substrate 20 when the display device 1 immediately after the irradiating step is carried to another place, for example.

As shown in FIG. 12, an area A2 inside of the inner divider line 11 and an area A3 between the inner divider line 11 and the outer divider line 12 are separated from an area A4 outside of the outer divider line 12, and the first sheet substrate 21 may come off in the areas A2 and A3 if the first sheet substrate 21 is only adhered to the first substrate 20 in the light blocking area A1 included in the area A4. In this regard, the protective film 13 adhered to the lower part of the display device 1 (Z1 direction side) covers the display area 5, and also extends to the light blocking area A1 across the inner divider line 11 and the outer divider line 12. The protective film 13 is thus disposed across the areas A2 to A4, and the protective film 13 thereby supports the areas A2 and A3 of the first sheet substrate 21 from below. In other words, applying the protective film 13 can prevent the first sheet substrate 21 from coming off when the display device 1 is carried.

[2-10. Second Delaminating Step]

Subsequently, as shown in FIG. 13, the first substrate 20 is delaminated from the first sheet substrate 21. In this embodiment, the second delaminating step corresponds to "delaminating step" of the present invention.

Here, a surface of the first sheet substrate 21 in the light blocking area A1 is adhered to the first sheet substrate 21. As such, the force required for delaminating the first substrate 20 in this step is larger than the force required for delaminating the second substrate 30 in the first delaminating step described above. The surface of the first sheet substrate 21 in the light blocking area A1 is adhered to the first sheet substrate 21, and thus, sometimes a crack or a fracture generated when the first sheet substrate 21 is delaminated occur in the light blocking area A1.

However, the inner divider line 11 and the outer divider line 12, which are formed by removing the lamination, are formed on the display device 1. As such, a crack or a fracture generated when the first sheet substrate 21 is delaminated does not reach the area A2 inside of the inner divider line 11 or the area A3 between the inner divider line 11 and the outer divider line 12. That is, forming the inner divider line 11 and the outer divider line 12 can prevent a crack or a fracture from reaching the display area 5 or an area included in a final product of the display device 1 (e.g., an area divided by a cut line L2 described later), and it is thereby possible to prevent yields of the display device 1 in the manufacturing process to be reduced.

[2-11. Second Adhering Step]

Next, as shown in FIG. 14, the protective film 14 is adhered to the surface of the first sheet substrate 21 from which the first substrate 20 is delaminated. Similarly to the protective film 13, the protective film 14 may be formed of a material such as PET.

[2-12. Cutting Step]

Next, the display device 1 is cut along the cut line L2 shown in FIGS. 11 and 14 to form the display device 1 shown in FIGS. 1 to 3. In other words, a shape of the display device 1 that is cut along the cut line L2 is a shape of a final product.

In this embodiment, as shown in FIG. 11, the cut line L2 is provided inside of the area A3 between the inner divider line 11 and the outer divider line 12 in a plan view. The cut line L2 runs along the inner divider line 11 and the outer divider line 12. As described above, a crack or a fracture generated when the first sheet substrate 21 is delaminated does not reach the area A2 inside of the inner divider line 11 or the area A3 between the inner divider line 11 and the outer divider line 12. As such, by proving the cut line L2 inside of the area A3 and cutting the display device 1 along the cut line L2, the area A4 on which a crack or a fracture is left can be cut off so that a crack or a fracture is not left on the display device 1, which is a final product.

Further, if a crack or a fracture is generated in the cut line L2 due to the cut along the cut line L2, the inner divider line 11 is formed between the cut line L2 and the display area 5, it is thereby possible to prevent the crack or the fracture generated in the cut line L2 from reaching the display area 5 across the inner divider line 11.

As described above, in the manufacturing process of the display device 1 according to this embodiment, the light blocking area A1 is formed in the area that does not overlap the display area 5 of the first substrate 20. For this reason, adhesiveness between the first substrate 20 and the first sheet substrate 21 is not reduced in the light blocking area A1 even if the surface of the first sheet substrate 21 is irradiated with light such as a laser beam and ablated. As such, in a case where the display device 1 immediately after irradiated with light is carried to another place, it is possible to prevent the first sheet substrate 21 from coming off from the first substrate 20.

In the manufacturing process of the display device 1 according to this embodiment, the inner divider line 11 and the outer divider line 12 are formed before the first substrate 20 is delaminated from the first sheet substrate 21. By forming a part where the lamination is linearly removed in this way, it is possible to prevent a crack or a fracture, which is generated in the light blocking area A1 when the first substrate 20 is delaminated from the first sheet substrate 21, from reaching the display area 5 or the area forming a final product of the display device 1 (i.e., an area divided by the cut line L2).

3. Modified Examples

The present invention is not limited to the above described embodiments and may be modified in various manners. In the following, examples (modified examples) in other modes for implementing the present invention will be described.

3-1. Modified Example (1)

Figure 15:
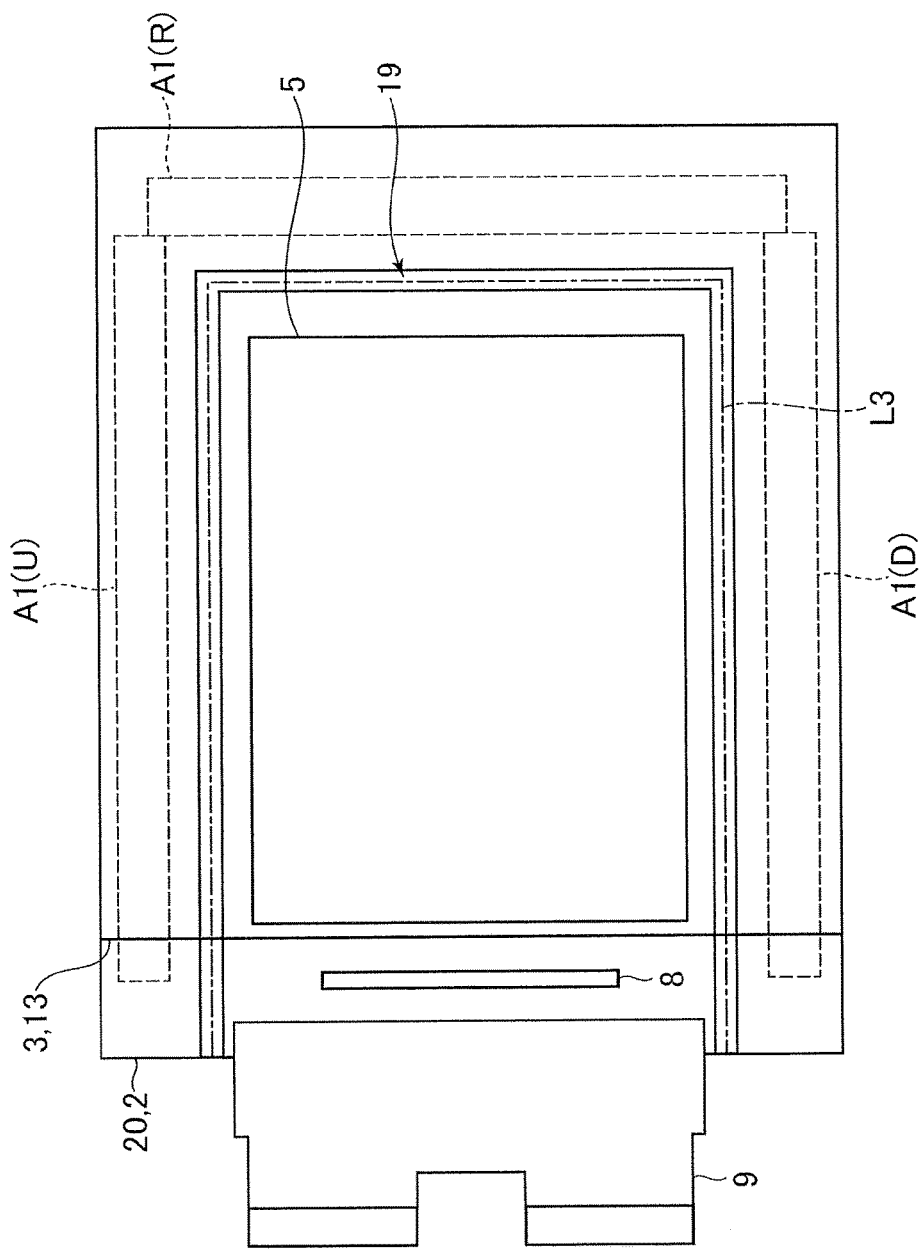
FIG. 15 is a top view of the display device 1 in a manufacturing process according to a modified example.
Figure 16:
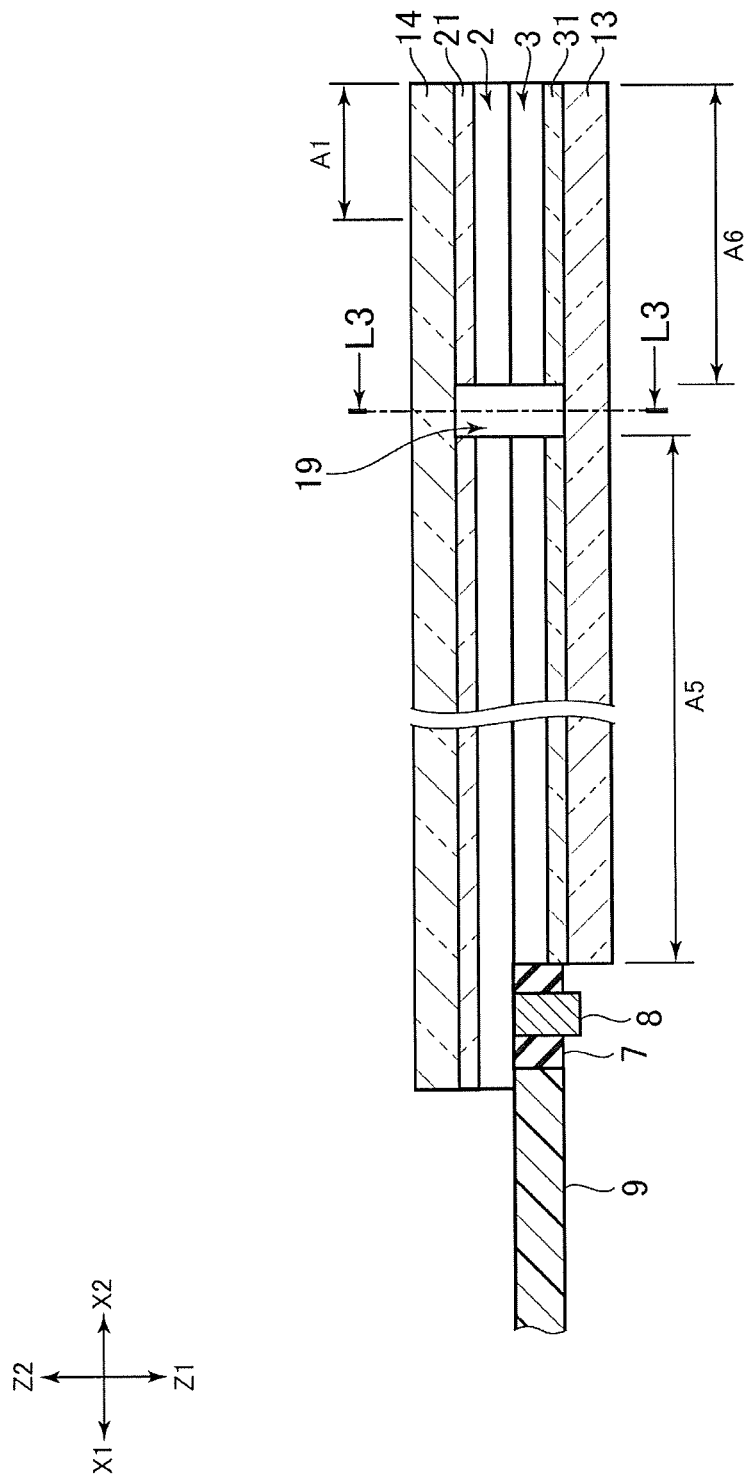
FIG. 16 is a schematic cross-sectional view of the display device 1 in a manufacturing process according to a modified example.

FIG. 15 is a top view of the display device 1 in the manufacturing process according to this modified example, and corresponds to FIG. 11 in the embodiment. FIG. 16 is a schematic cross-sectional view of the display device 1 in the manufacturing process according to this modified example, and corresponds to FIG. 14 in the embodiment.

In the embodiment, the case has been explained in which two divider lines, the inner divider line 11 and the outer divider line 12, are formed, the number of divider lines formed in the display device 1 is not limited to this. For example, as shown in FIGS. 15 and 16, the number of divider lines formed by removing the first and second laminations 2 and 3 may be one.

In this modified example, a divider line 19 is formed between the display area 5 and the light blocking area A1. Similarly to the two divider lines 11 and 12 described in the embodiment, the divider line 19 is formed in a way to run along the respective edges of the display area 5 in the Y1 direction, the X2 direction, and the Y2 direction, and, in the display area 5 in the Y1 direction and the Y2 direction, extend to the end of the display device 1 in the X1 direction. Further, in this modified example, a cut line L3 for cutting off the display device 1 is provided inside of the area A3 between the inner divider line 11 and the outer divider line 12 in a plan view.

As shown in FIG. 16, the first and second laminations 2 and 3 are divided into an area A5 inside of the divider line 19 and an area A6 outside of the divider line 19. As such, a crack or a fracture generated in the light blocking area A1 when the first sheet substrate 21 is delaminated does not reach the area A5 inside of the divider line 19. Further, the display device 1 is cut off along the cut line L3 provided inside of the divider line 19, and the area A6 with a crack or a fracture is thereby cut off so that the crack or the fracture is not left on the display device 1, which is a final product.

3-2. Modified Example (2)

In the embodiment, the case has been explained in which the second substrate 30 is delaminated from the second lamination 3 including the color filter layer 33 and applied with the protective film 13, then the first substrate 20 is delaminated from the first lamination 2 including the circuit layer 23 and the organic layer 27, although the first and second substrates 20 and 30 may be delaminated in reverse order. More specifically, the first substrate 20 may be delaminated from the first sheet substrate 21 in the first delaminating step, the protective film 14 may be adhered to the first sheet substrate in the first adhering step, the light blocking area A1 may be formed in the second substrate 30 side in the light blocking step, the second substrate 30 may be irradiated with light such as a laser beam and delaminated from the second sheet substrate 31 in the irradiating step and the second delaminating step, and the protective film 13 may be adhered to the second sheet substrate 31 in the second adhering step.

In this modified example, similarly to the protective film 13 described in the embodiment, it is desired that the protective film 14 adhered to the display device 1 covers the display area 5 in a plan view, and extends to the light blocking area A1 across the inner divider line 11 and the outer divider line 12. This structure enables that the protective film 14 supports, from below, the areas A2 and A3 of the first sheet substrate 21 irradiated with light such as a laser beam, and thus it is possible to prevent the first sheet substrate 21 from coming off when the display device 1 is carried to another place.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A manufacturing method of a display device comprising:
    preparing a structure including a substrate and a lamination foiled on the substrate, the lamination including a sheet substrate having flexibility and adhered to the substrate, a plurality of light-emitting layers respectively provided to a plurality of pixels disposed in a display area, and a sealing layer covering the light-emitting layers, all of the pixels being located in the display area;
    forming a light blocking area on the substrate, the light blocking area not overlapping the display area in a plan view and being in contact with the substrate;
    irradiating light on a side of the substrate after the light blocking, the side being opposite to the sheet substrate; and
    delaminating the substrate from the sheet substrate after the irradiating.

2. The manufacturing method of the display device according to claim 1, further comprising forming a first divider line by removing the lamination, which includes the sheet substrate, between the display area and the light blocking area before the delaminating.

3. The manufacturing method of the display device according to claim 2, further comprising adhering a protective film on an opposite side of the lamination from the substrate after the first dividing and before the irradiating, wherein
    the protective film covers the display area in a plan view and extends from the display area to the light blocking area across the first divider line.

4. The manufacturing method of the display device according to claim 2, further comprising:
    forming a second divider line by removing the lamination between the display area and the light blocking area before the delaminating, the second divider line being closer to the light blocking area than the first divider line is;
    cutting the lamination between the first divider line and the second divider line after the delaminating.

5. The manufacturing method of the display device according to claim 4, further comprising adhering a protective film on an opposite side of the lamination from the substrate after the first dividing and before the irradiating, wherein
    the protective film covers the display area in a plan view and extends from the display area to the light blocking area across the second divider line.

6. The manufacturing method of the display device according to claim 1, wherein
    the light blocking area includes at least two areas opposite to each other, the two areas interposing the display area.

7. The manufacturing method of the display device according to claim 1, wherein the display area is substantially rectangular in a plan view, and the light blocking area includes an area that runs along at least one of edges of the display area in a plan view.

8. The manufacturing method of the display device according to claim 1, further comprising attaching a flexible printed board to the sheet substrate, wherein the light blocking area does not overlap an area to which the flexible printed board is attached in a plan view.

* * * * *